US008698323B2

(12) United States Patent
Mohammed et al.

(10) Patent No.: US 8,698,323 B2
(45) Date of Patent: Apr. 15, 2014

(54) MICROELECTRONIC ASSEMBLY TOLERANT TO MISPLACEMENT OF MICROELECTRONIC ELEMENTS THEREIN

(75) Inventors: Ilyas Mohammed, Santa Clara, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/525,514

(22) Filed: Jun. 18, 2012

(65) Prior Publication Data

US 2013/0334698 A1    Dec. 19, 2013

(51) Int. Cl.
*H01L 29/82* (2006.01)

(52) U.S. Cl.
USPC ............. 257/777; 257/79; 257/692; 257/723; 257/725; 257/778; 257/786

(58) Field of Classification Search
USPC ......... 257/692, 701, 723, 725, 737, 773, 774, 257/776, 777, 778, 779, 780, 781, 786, 797, 257/787, E23.06
See application file for complete search history.

(56) References Cited

U.S. PATENT DOCUMENTS

| 3,680,205 | A * | 8/1972 | Kravitz | 438/411 |
|---|---|---|---|---|
| 5,907,477 | A * | 5/1999 | Tuttle et al. | 361/760 |
| 6,815,832 | B2 * | 11/2004 | Shibata | 257/778 |
| 7,468,541 | B2 * | 12/2008 | Fukuzumi | 257/421 |
| 7,541,682 | B2 * | 6/2009 | Song et al. | 257/786 |
| 7,656,032 | B2 * | 2/2010 | Kariya et al. | 257/734 |
| 8,581,402 | B2 * | 11/2013 | Yu et al. | 257/737 |
| 2002/0173133 | A1 | 11/2002 | Towle et al. | |
| 2003/0116866 | A1 * | 6/2003 | Cher 'Khng et al. | 257/780 |
| 2004/0113281 | A1 * | 6/2004 | Brandenburg et al. | 257/778 |
| 2004/0178488 | A1 * | 9/2004 | Bolken et al. | 257/686 |
| 2005/0026363 | A1 * | 2/2005 | Cheng et al. | 438/257 |
| 2005/0106855 | A1 * | 5/2005 | Farnworth | 438/622 |
| 2008/0116584 | A1 * | 5/2008 | Sitaram | 257/777 |
| 2008/0211111 | A1 * | 9/2008 | Park et al. | 257/778 |
| 2008/0224306 | A1 * | 9/2008 | Yang | 257/725 |
| 2011/0309503 | A1 | 12/2011 | Yamagata | |
| 2012/0126229 | A1 | 5/2012 | Bower | |
| 2012/0126389 | A1 | 5/2012 | Desai et al. | |
| 2012/0175786 | A1 * | 7/2012 | Kiong et al. | 257/778 |
| 2012/0267777 | A1 | 10/2012 | Haba et al. | |

(Continued)

OTHER PUBLICATIONS

International Search Report and Written Opinion for Application No. PCT/US2013/046345.

(Continued)

*Primary Examiner* — Michael Shingleton
(74) *Attorney, Agent, or Firm* — Lerner, David, Littenberg, Krumholz & Mentlik, LLP

(57) ABSTRACT

A microelectronic assembly tolerant to misplacement of microelectronic elements therein may include a molded structure containing a plurality of microelectronic elements. Each microelectronic element has elements contacts having first and second dimensions in respective first and second directions that are transverse to each other, where the first dimension is at least twice the second dimension. In addition, the assembly may include a conductive redistribution layer including conductive vias extending through a dielectric layer to the element contacts of the respective microelectronic elements, where the conductive vias have a third dimension in a third direction and a fourth dimension in a fourth direction, and where the fourth direction is transverse to the third and first directions and the fourth dimension is greater than the third dimension.

20 Claims, 14 Drawing Sheets

(56) References Cited

U.S. PATENT DOCUMENTS

2012/0268899 A1    10/2012  Haba et al.
2012/0288998 A1*   11/2012  Lee et al. .................. 438/113
2013/0249088 A1*    9/2013  Scanlan et al. ............. 257/737

OTHER PUBLICATIONS

The Monolithic 3D-IC: A Disruptor to the Semiconductor Industry, pp. 1-41, MonolithIC 3D™ Inc. Patents Pending. The Monolithic 3D-1C, Invited Talk at the 3D Workshop at the Intl. Conference on Technology & Instrumentation in Particle Physics, Jun. 2011.

Dorsey, Patrick, "Xilinx Stacked Silicon Interconnect Technology Devlivers Breakthrough FPGA Capacity, Bandwidth,, and Power Efficiency", White Paper: Virtex-7 FPGAs, XP380 (V1.0), pp. 1-10, Oct. 27, 2010.

U.S. Appl. No. 13/195187 dated Aug. 1, 2011.

* cited by examiner

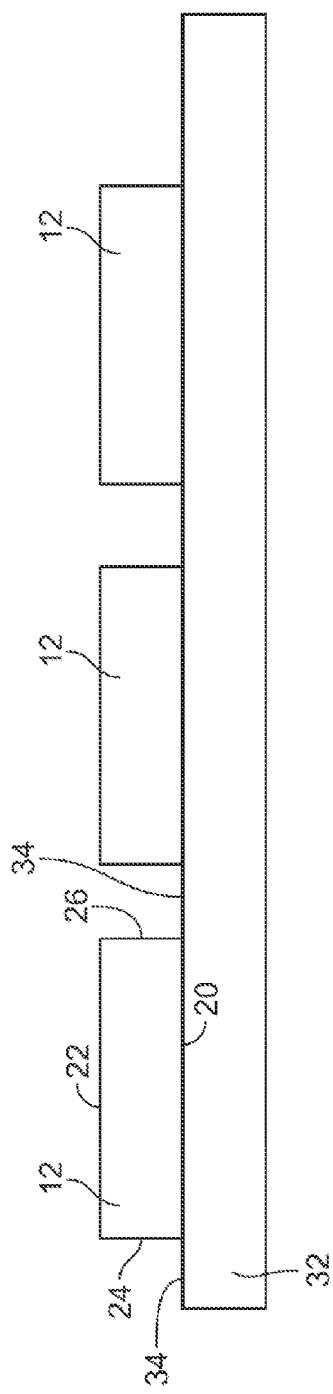
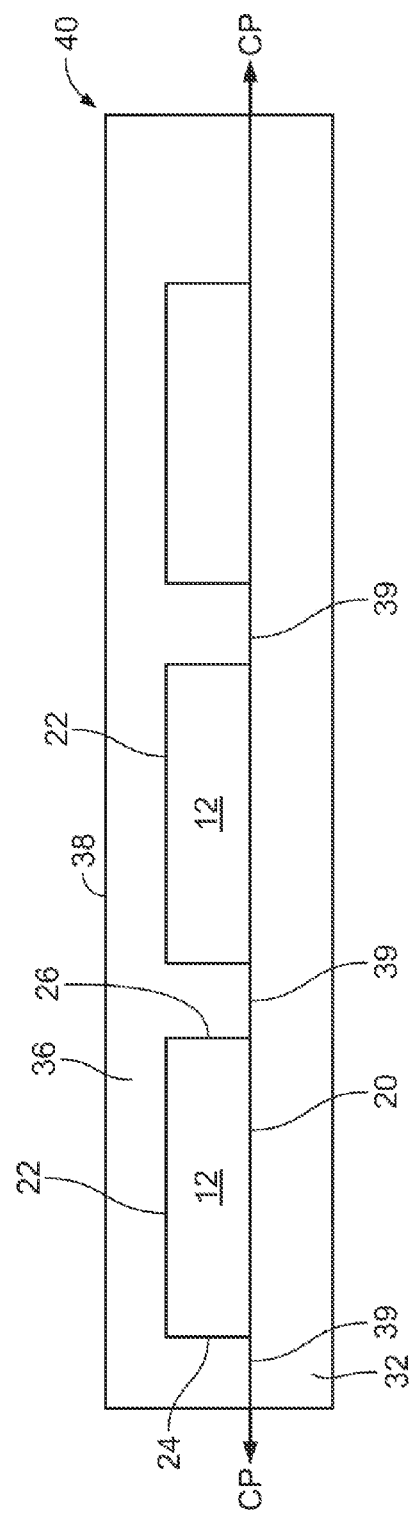

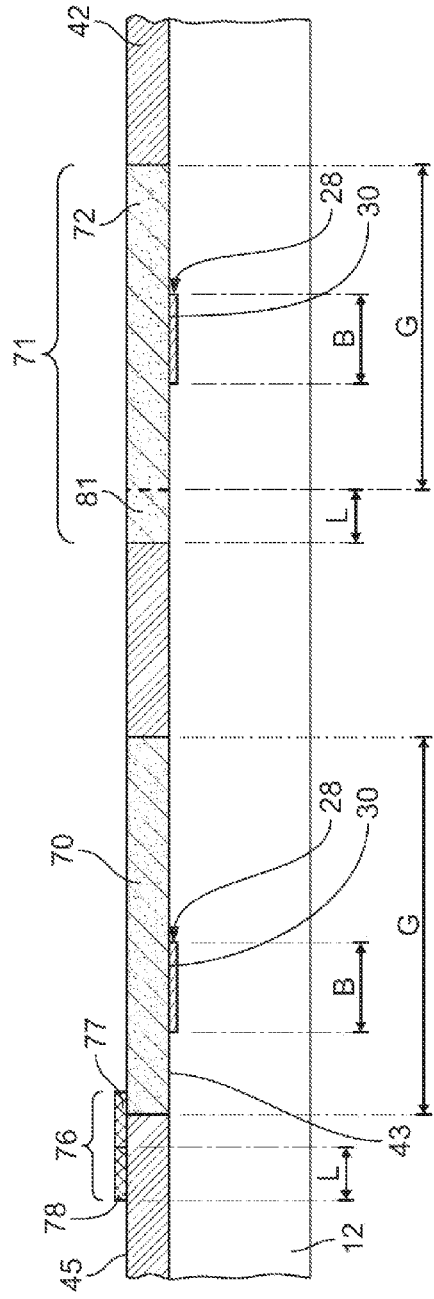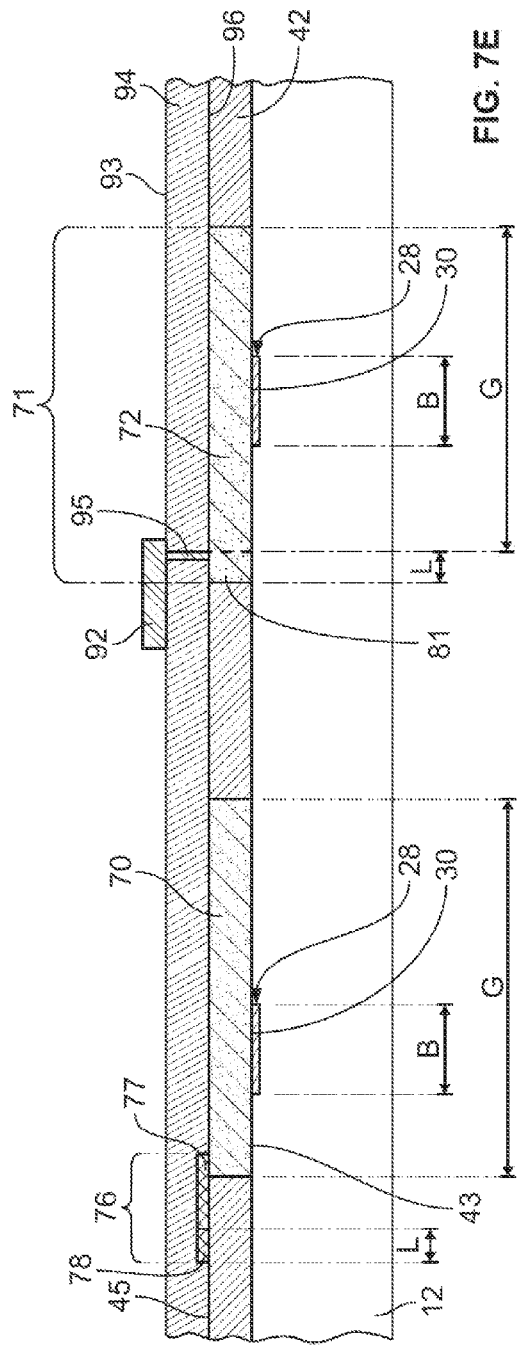

MICROELECTRONIC ASSEMBLY TOLERANT TO MISPLACEMENT OF MICROELECTRONIC ELEMENTS THEREIN

BACKGROUND

The subject matter of the present application relates to a microelectronic assembly including a plurality of microelectronic elements and, in particular, a microelectronic assembly including a reconstituted wafer level package of microelectronic elements and to methods of fabricating the assembly.

Semiconductor chips are flat bodies with contacts disposed on a front surface that are connected to internal electrical circuitry of the chip. The chips are typically packaged to form a microelectronic package having terminals that are electrically connected to the chip contacts. The terminals of the package may then be connected to an external microelectronic component, such as a circuit panel.

It is often desirable to include a plurality of chips in a microelectronic assembly. The chips in the assembly, for example, may be part of a microelectronic package fabricated by encapsulating a plurality of chips, which have been cut from a semiconductor wafer into individual chips, in a molded structure commonly known as a reconstituted or embedded wafer level package. The element contacts of the chips typically have a shape of a substantially uniform radial dimension, such as a circle, square, etc. In addition, the element contacts desirably are arranged on a front face of the chip spaced from each other at a very fine pitch, which in some examples is typically 10-80 microns.

The microelectronic assembly, which is to include such reconstituted chip package, usually contains an interconnection structure having interconnection elements arranged to contact the element contacts of the chips of the package, so as to electrically interconnect the element contacts of a chip to each other or an element contact of one chip with an element contact of another chip of the package. As a result of the typical very fine pitch of the element contacts, highly accurate placement of the chips is needed during the process of encapsulating the chips within the package, to provide that the chips are fixed in position in the package so that the interconnection elements of the interconnection structure, which are arranged at positions according to an interconnection design layout for the assembly, contact a sufficient portion of an exposed surface area of the corresponding chip contacts to ensure reliable electrical interconnections therebetween.

Very high accuracy chip placement equipment that provides for chip placement according to typical pitches, however, is costly. Also, even when such equipment is used, a reconstituted package is not always obtained for which very fine interconnection elements, which have a pitch comparable to the pitch of the chip contacts, can be used to contact the corresponding chip contacts so as to form reliable electrical interconnections therebetween in accordance with the interconnection design layout for the microelectronic assembly including the package.

A typical interconnection structure for a microelectronic assembly is a silicon interposer, which is often used to electrically interconnect chip contacts to conductive elements of another element, such as a substrate, of the microelectronic assembly. The interconnection elements of the interposer include very small size microbumps on one surface which are to contact corresponding chip contacts, and larger conductive masses at a surface opposite the one surface that provide for an electrical interconnection between the chip contacts and contacts of the substrate. The microbumps typically have a diameter of 20 microns, and for example, may be arranged with a 40 micron pitch. The fabrication of an interposer with microbumps having the typical pitch, however, is difficult and costly, because each of the microbumps needs to be formed using only a very small amount of solder and often several metal layers, such as four or more, need to be used to form the electrical interconnections between the microbumps and the larger masses on the other side of the interposer. Thus, the use of an interposer in a microelectronic assembly may substantially increase the cost of the assembly, and the interposer also constitutes an extra component that increases the thickness of the assembly. Further, when a larger size interposer is used, the interposer may cause warping within the assembly, which adversely impacts the reliability of the connections between the microbumps and the chip contacts.

In addition, a microelectronic assembly including multiple chips can be fabricated using a wafer or portion thereof including multiple chips. Oftentimes, the number of chips desired for inclusion in a microelectronic assembly requires use of a large region or the entirety of a wafer, such that the size needs to be about 20 mm or greater in diameter. A wafer of such size, however, often may have a degree of warping, which results in the exposed surface areas of the chip contacts not being in a same plane. Consequently, contact of interconnection elements, such as the microbumps of the interposer, with a sufficient portion of the exposed surface area of the element contacts of the chips may be difficult to attain because of the warping of the wafer. As a result, manufacture of microelectronic assemblies including such large sized wafers can have a very low yield of microelectronic assemblies having reliable electrical interconnections between the chip contacts and other conductive elements of the microelectronic assembly.

Therefore, improvements are desirable in the art of producing a microelectronic assembly including a plurality of microelectronic elements that has an increased tolerance for misplacement of the microelectronic elements, such as within a reconstituted wafer level package contained in the assembly.

SUMMARY

In accordance with one embodiment, a microelectronic assembly may include at least first and second microelectronic elements each having a front face arranged in a common plane and arranged side by side in a molded structure, where each of the microelectronic elements has a plurality of element contacts at the front face, each of the element contacts has a first dimension in a first direction parallel to the common plane and having a second dimension in a second direction parallel to the common plane, the first direction is transverse to the second direction, and the first dimension is at least twice the second dimension. In addition, the assembly may include a dielectric layer extending along the front face of each of the first and second microelectronic elements and onto an intermediate surface between adjacent edges of the first and second microelectronic elements. Further, the assembly may include a conductive redistribution layer including first and second conductive vias extending through the dielectric layer to first and second element contacts of the first and second microelectronic elements, respectively, where each of the first and second conductive vias has a third dimension in a third direction and a fourth dimension in a fourth direction, the fourth direction is transverse to the third direction and the first direction, and the fourth dimension is greater than the third dimension.

In accordance with another embodiment, a microelectronic assembly may include at least first and second microelectronic elements each having a front face arranged in a common plane and arranged side by side in a molded structure, where each of the microelectronic elements has a plurality of element contacts at the front face, each of the element contacts has a first dimension in a first direction parallel to the common plane and a second dimension in a second direction parallel to the common plane, the first direction is transverse to the second direction, and the first dimension is at least twice the second dimension. In addition, the assembly may include a dielectric layer extending along the front face of each of the first and second microelectronic elements and onto an intermediate surface between adjacent edges of the first and second microelectronic elements. Further, the assembly may include a conductive redistribution layer including a conductive portion disposed within an opening of the dielectric layer having a uniform depth and extending from the first microelectronic element to the second microelectronic element, where the conductive portion includes a first conductive portion contacting a first element contact of the first microelectronic element, a second conductive portion contacting a second element contact of the second microelectronic element and an intermediate conductive portion extending from the first conductive portion to the second conductive portion, and where the first and second conductive portions have a third dimension in a third direction and a fourth dimension in a fourth direction, the fourth direction is transverse to the third direction and the first direction, and the fourth dimension is greater than the third dimension.

In accordance with another embodiment, a method of making a microelectronic assembly may include providing a molded structure including at least first and second microelectronic elements each having a front face arranged in a common plane and arranged side by side in a molded structure, each of the microelectronic elements having a plurality of element contacts at the front face, each of the element contacts having a first dimension in a first direction parallel to the common plane and having a second dimension in a second direction parallel to the common plane, the first direction being transverse to the second direction, the first dimension being at least twice the second dimension. In addition, the method may include patterning first and second conductive vias extending through a dielectric layer, the dielectric layer extending along the front face of each of the first and second microelectronic elements and onto an intermediate surface between adjacent edges of the first and second microelectronic elements, to first and second element contacts of the first and second microelectronic elements, each of the first and second conductive vias having a third dimension in a third direction and a fourth dimension in a fourth direction, the fourth direction being transverse to the third direction and the first direction, and the fourth dimension being greater than the third dimension.

BRIEF DESCRIPTION OF DRAWINGS

FIGS. 3-4 are diagrammatic sectional views illustrating further stages in a method of fabricating a molded structure including a plurality of microelectronic elements arranged side by side, in accordance with one embodiment of the disclosure

FIG. 7D is a diagrammatic sectional view of the portion of the assembly as shown in FIG. 7C taken at cross-sectional line 7D-7D.

FIG. 7E is a diagrammatic sectional view of a portion of a microelectronic assembly, in accordance with another embodiment of the disclosure.

DETAILED DESCRIPTION

A microelectronic assembly 10 including microelectronic elements 12, such as semiconductor chips, arranged side by side in a molded structure 40 may be fabricated in accordance with an embodiment of the disclosure, as shown in FIGS. 1-7. Each chip may embody a plurality of active devices (e.g., transistors, diodes, etc.), a plurality of passive devices (e.g., resistors, capacitors, inductors, etc.), or both active devices and passive devices. Typically, at least one chip embodies active devices or both active and passive devices. Each chip may be same type as the other chips in the molded structure, or the chips may be of different types.

In a particular embodiment, one or more of the chips can be configured to have a predominant function as a logic chip, e.g., a programmable general or special purpose processor, a microcontroller, a field programmable gate array ("FPGA") device, an application specific integrated circuit ("ASIC"), a digital signal processor, among others. In such embodiment, one or more other chips in the assembly 10 may be configured to have a predominant function other than as a logic chip. For example, one or more logic chips may be combined with one or more storage array chips having predominant memory function in a "system in a package" ("SIP") configuration. Such memory storage array chip may include a volatile memory storage area, e.g., dynamic random access memory ("DRAM"), static random access memory ("SRAM"), a nonvolatile memory storage array such as flash memory or magnetic random access memory ("MRAM"), or a combination of volatile and nonvolatile storage arrays. In a particular embodiment, a "system on a chip" ("SOC") which combines logic function and substantial other function, e.g., substantial memory function, on the same chip, may be combined with one or more additional chips in the microelectronic assembly 10.

Figure 1C:
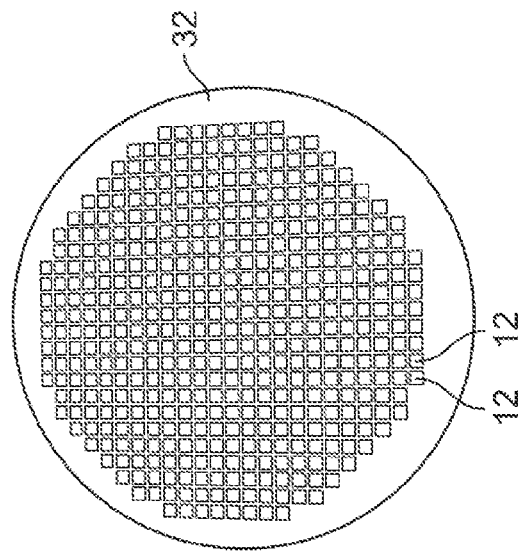
FIGS. 1A, 1B and 1C illustrate stages in a method of fabricating a molded structure including a plurality of microelectronic elements, in accordance with one embodiment of the disclosure.
Figure 1B:
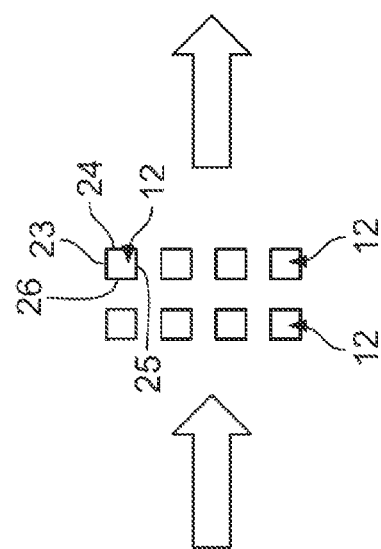
Figure 1A:
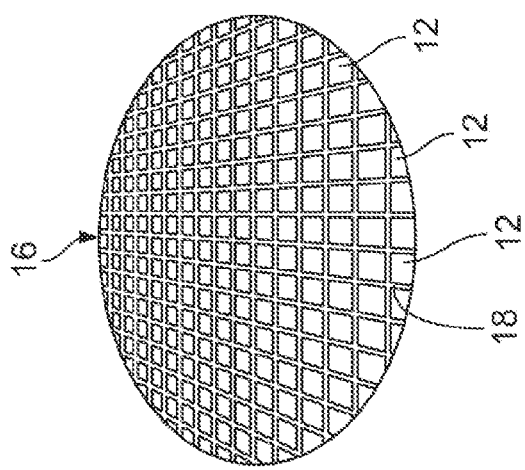

Referring to FIG. 1A, a semiconductor wafer 16 or portion thereof may include a plurality of chips 12. The wafer 16, which may be in the shape of a circular wafer, preferably includes numerous rows of chips 12 aligned along orthogonal axes, where the chips are formed integral with one another on the wafer 16 using conventional semiconductor process techniques. Adjacent chips are attached to each other at edges which form saw lanes or strips 18 where the wafer can be cut without damaging the individual chips. Referring to FIG. 1B, the wafer 16 including the integral chips 12 may be cut at the saw lanes 18 to obtain individual chips 12.

Figure 2:
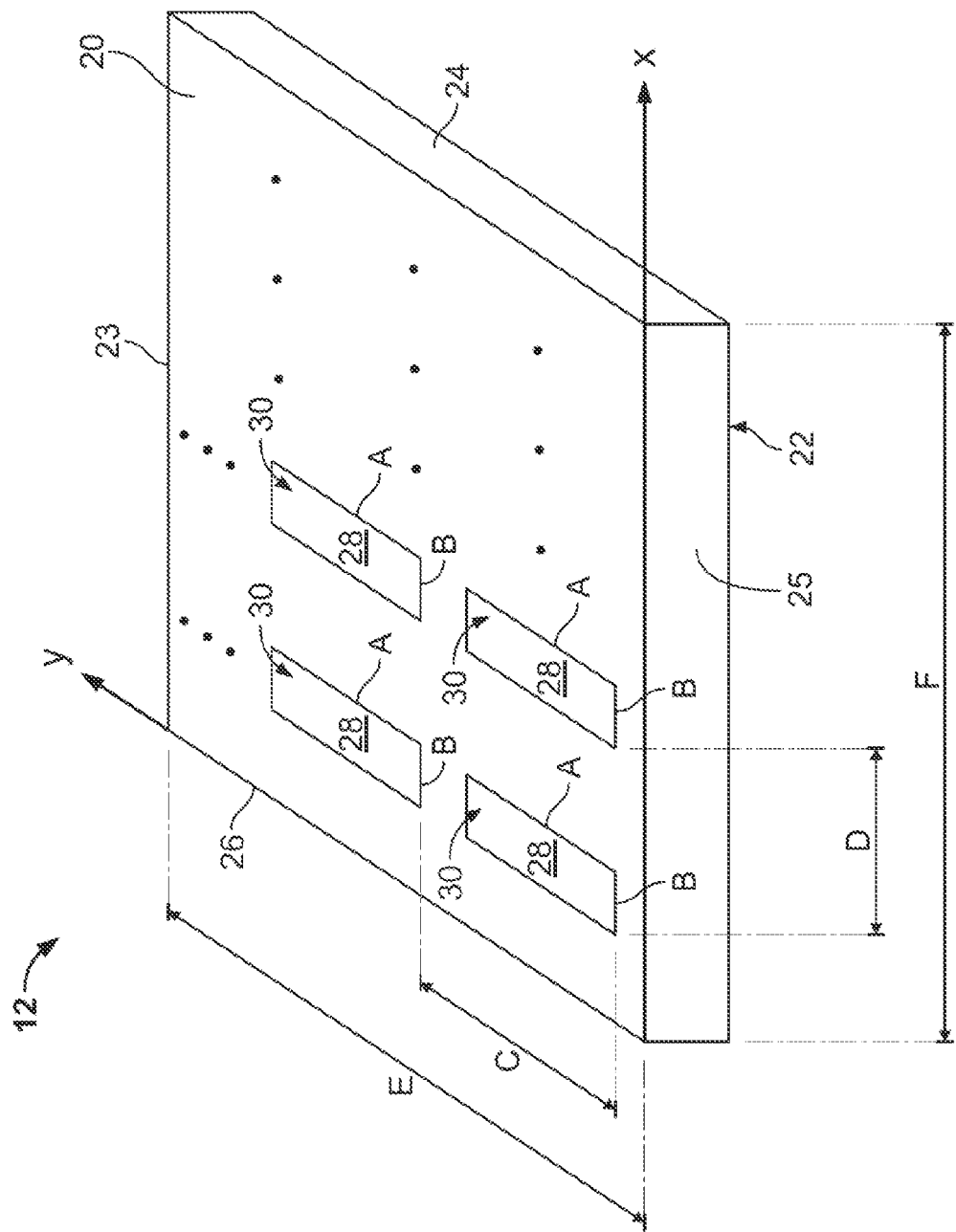
FIG. 2 is a perspective view of an exemplary microelectronic element, in accordance with one embodiment of the disclosure.

Referring to FIG. 2, which is a perspective view of an exemplary chip 12 cut from the wafer 16, the chip 12 may have a front surface face 20, a rear surface face 22 opposite the front face 22, opposing first and second edges 24 and 26 extending between the front and rear surfaces, and opposing third and fourth edges 23 and 25 extending between the front and rear surface surfaces, where the edges 24, 26 are transverse and may be orthogonal to the edges 23, 25. Element or chip contacts 28 are exposed at the front face 20 of the chip 12, and may be electrically connected to circuitry or other conductive elements (not shown) within the chip 12.

As used in this disclosure, an electrically conductive feature can be considered "exposed at" a surface, such as at a surface that forms a top or front surface of a semiconductor chip, if the metallic feature is accessible to a contact or bonding material applied to such surface. Thus, a metallic feature which projects from the surface or which is flush with the surface is exposed at such surface; whereas a recessed conductive feature disposed in or aligned with a hole in a layer of material, such as a dielectric layer, extending to the surface is also exposed at such surface.

The contacts 28 may include aluminum or copper. A front surface 30 of the contact 28 exposed at the front face 20 of the chip may be covered with a metal or other electrically conductive material that protects the contact 28 from damage during subsequent processing, such as may occur during lasing of dielectric material overlying the front face of the chip as described below, while providing that the contact may be electrically connected to other electrically conductive material or elements through the conductive material covering the contact. See U.S. application Ser. No. 13/195,187 filed Aug. 1, 2011, incorporated by reference herein.

Referring to FIG. 2, the front surface 30 of the contacts 28 may have a first dimension A extending in a first direction and a second dimension B in a second direction transverse to the first direction. In one embodiment, the front surface 30 of each of the element contacts 28 of the chip 12 may have the same dimensions, and the contacts may be arranged on the front face of the chip according to a predetermined pitch. In addition, each of the chips 12 included in the molded structure 40 may be cut from a same wafer 16, or alternatively different wafers, and have contacts with front surfaces of the same dimensions and the contacts arranged respectively on front faces of the chips according to a same pitch.

Referring to FIG. 2, an exemplary arrangement of the front surfaces 30 of the contacts 28 of the chip 12 is illustrated with reference to an x-y coordinate system having x and y axes orthogonal to each other and extending parallel to a plane in which the front face 20 of the chip extends. Such x-y coordinate system is referred to below in connection with the text accompanying the description of FIGS. 7-10 and 13 to illustrate positioning of the chip contacts relative to conductive portions of a conductive redistribution layer 50 included in the microelectronic assembly 10. As discussed in detail below, the conductive portions of the redistribution layer are configured and arranged according to a predetermined redistribution layer interconnection layout for the assembly 10, so as to contact, and provide reliable electrical interconnections with, the contacts 28 of the chips 12 of the assembly 10. Referring again to FIG. 2, for each contact 28 on the chip, the front surface 30 has the first dimension A extending parallel to the y axis and the second dimension B extending parallel to the x axis. In accordance with the present invention, the dimension A may be elongated relative to the dimension B and, in one embodiment, may be at least twice the length of the dimension B. In one embodiment, the front surface 30 has an exposed surface area that is substantially rectangular, and the dimension A is 15 microns and the dimension B is 5 microns. For ease of reference, when reference is made below to the dimensions of the contacts or a conductive portion of the redistribution layer 50, it is to be understood that the dimensions are of exposed surface areas thereof.

Still referring to FIG. 2, the element contacts on the chip may be arranged on the chip in accordance with a pitch having a length C extending in a direction parallel to the y axis and a length D extending in a direction parallel to the x axis. In one embodiment, C and D may be 20 microns and 40 microns, respectively, and the chip may have about 14,000 element contacts arranged thereon in accordance with the pitch. Further, the edges 24, 26 of the chip 12 may have a dimension E in a direction parallel to the y axis and the edges 23, 25 may have a dimension F in a direction parallel to the x axis. In one embodiment, E is equal to 10 mm and F is equal to 30 mm.

Referring to FIG. 1C and FIG. 3, the individual cut chips 12, each desirably having element contacts of the same dimension and arranged on the front face of the chip according to a same predetermined pitch, may be placed upon a temporary carrier 32, using conventional chip placement equipment, such as a pick-and-place tool, in a side by side arrangement with the front faces 20 of the chips facing a surface 34 of the carrier 32. In some embodiments, the chips 12 placed on the carrier 32 may have contacts arranged according to a plurality of different pitches, where the different pitches are within a predetermined range of pitches. The carrier plate 32 may be formed from dielectric material or glass. A layer of adhesive (not shown) may be used to maintain the chips at the positions on the surface 34 at which the chips are placed by the chip placement equipment. The adhesive layer, for example, may be a flowable adhesive or tacky (partially cured) adhesive applied to the front faces of the chips before the chips are placed upon the carrier surface. The adhesive layer may include a die attach adhesive, and be selected for properties of compliancy, thermally conductivity, impermeability to moisture or other contaminant, or a combination of such properties. Alternatively, the adhesive layer may be deposited as a liquid onto the surface 34 of the carrier, after which the chips 12 are attached to the adhesive layer on the carrier. Although FIG. 3 shows three chips 12, it is to be understood that any number of cut chips may be arranged side by side on the surface of a carrier as desirable for fabricating a molded structure containing a plurality of chips.

Referring to FIG. 4, after the chips are placed onto the surface of the carrier 32 using an adhesive, a planarized encapsulant 36 may be formed over the rear faces 22 and the carrier 32. The encapsulant 36 typically surrounds the edges 24, 26 and the edges 23, 25 (FIG. 2) of each of the chips 12, and is formed on uncovered portions of the surface 34 extending away from the edges 23, 24, 25 and 26 of the chips 12. The encapsulant 36 with the chips embedded therein forms the molded structure 40.

The encapsulant 36, which protects the encapsulated components from the external environment, may include dielectric material or resin with insulating properties. In one embodiment, the encapsulant may be formed by a molding process that forms a major planar surface 38 spaced from and parallel to the rear surfaces 22 of the chips 12, and planar surface portions 39 which oppose the surface 38, extend away from the edges of the chips along uncovered portions of the surface 34 and are parallel to the surface 38. The planar surface 38 may extend away from edges of the chips positioned along an outer perimeter of the side by side arrangement of the chips on the carrier 32. In the molded structure 40, the front faces 20 of the respective chips may be in a common plane CP. The carrier plate 32 may be removed, such as by sanding, etching or like techniques, following formation of the encapsulant 36, to obtain the molded structure 40 by itself.

Following formation of the encapsulant 36, the positions of the chips within the molded structure 40, and thus the positions of element contacts at the front faces of the respective chips, are fixed. The positioning of the element contacts of the respective chips in relation to desired positions, where the desired positions are based on an interconnection layout for a microelectronic assembly that is to include the molded structure, depends on the accuracy with which the chips are placed on the carrier during a molding process. The contacts of the respective chips in the molded structure may or may not be fixed at positions that provide that a sufficient area of the front surface of the element contacts contacts corresponding conductive elements used to implement an interconnection layout for the assembly, such that reliable electrical connections at the element contacts are ensured. As discussed in detail below, in accordance with the present invention, the dimensions and pitch of the element contacts of the chips included in a molded structure, and the dimensions of conductive portions of a conductive redistribution layer of a microelectronic assembly that are to contact the corresponding element contacts, advantageously provide for a tolerance for misplacement of the chips, and thus misplacement of the element contacts of the respective chips, in the molded structure. In this way, element contacts of respective chips can be positioned within the molded structure at a range of positions, and still provide that reliable electrical connections between the element contacts and corresponding conductive portions contacting the element contacts are obtained.

Figure 5:
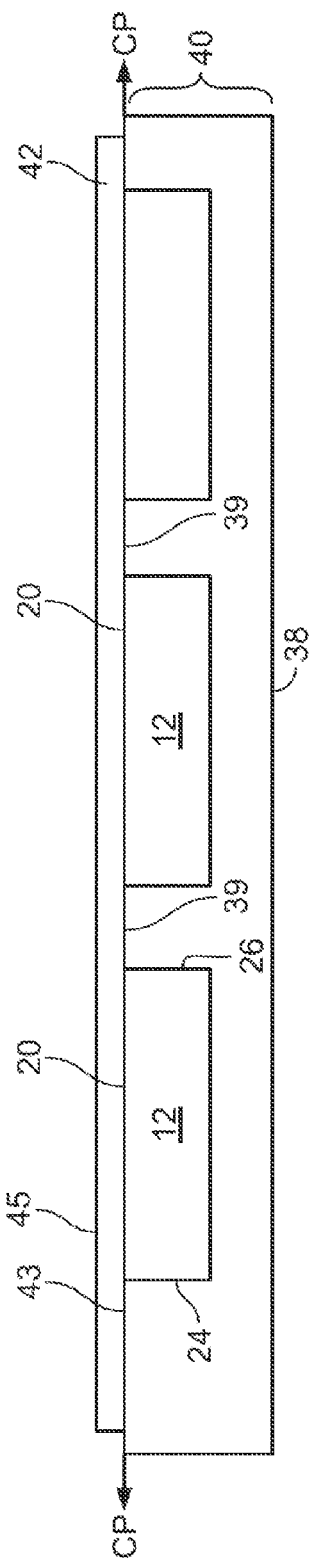
FIGS. 5 and 6 are diagrammatic sectional views illustrating stages in a method of fabricating a microelectronic assembly including a molded structure with a plurality of microelectronic elements arranged side by side, in accordance with one embodiment of the disclosure.

Referring to FIGS. 4 and 5, following removal of the carrier 32, the molded structure 40 may be flipped over such that front faces of the chips face upwardly. A layer of dielectric material 42, such as a dielectric passivation layer, may be formed with a surface 43 covering and extending along the front faces 20 of the chips 12 and the surface portions 39 of the encapsulant 36, and having a surface 45 opposite the surface 43.

As used in this disclosure, terms such as "upwardly," "downwardly," "vertically" and "horizontally" should be understood as referring to the frame of reference of the element specified and need not conform to the normal gravitational frame of reference. Also, for ease of reference, directions are stated in this disclosure with reference to "front" faces of the chips 12 of the molded structure 40, as shown in FIG. 5. Generally, directions referred to as "upward" or "rising from" shall refer to the direction orthogonal to and away from the front surfaces of the chips 12. Directions referred to as "downward" shall refer to the directions orthogonal to the front faces of the chips and opposite the upward direction. A "vertical" direction shall refer to a direction orthogonal to front faces of the chips. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

In accordance with the present invention, a conductive layer, e.g., a conductive redistribution layer 50, may be formed over the front faces of the chips and include, within openings in the dielectric layer 42, conductive portions which have predetermined dimensions and a predetermined arrangement in accordance with predetermined conductive layer or redistribution layer layout for a microelectronic assembly. The conductive portions may contact corresponding element contacts of the molded structure to provide reliable electrical connections therebetween, so long as the element contacts, which have predetermined dimensions and a predetermined pitch in accordance with the redistribution layout, are at positions within a predetermined tolerance for misplacement of the element contacts, which is determined in accordance with the redistribution layout. The predetermined tolerance for misplacement of element contacts corresponds to those positions of the element contacts which are displaced with respect to an ideal or "perfect" placement position of the element contact for contact with the corresponding conductive portion, but still provide for contact with the corresponding conductive portions to form reliable electrical connections therebetween. The predetermined tolerance for misplacement in accordance with the redistribution layout is illustrated below with reference to FIGS. 7-13 and the exemplary molded structure 40. It is noted that when the element contacts of the chips are positioned in the molded structure 40 so that an electrical interconnection between at least one conductive portion of the redistribution layer and one element contact of one of the chips according to the redistribution layer layout is absent, a predetermined functionality of the chips operating in combination may not be obtained.

In some embodiments, the conductive redistribution layer may include conductive portions extending in directions parallel to the front faces of the chips, such as in openings in the dielectric layer 42 extending along the front faces 20 of the chips and along the surface portions 39 of the encapsulant, and conductive portions extending along the surface 45 of the dielectric layer 42. The conductive portions have dimensions and are arranged according to a redistribution layout specific to the microelectronic assembly that is to include the molded structure 40.

Figure 6:
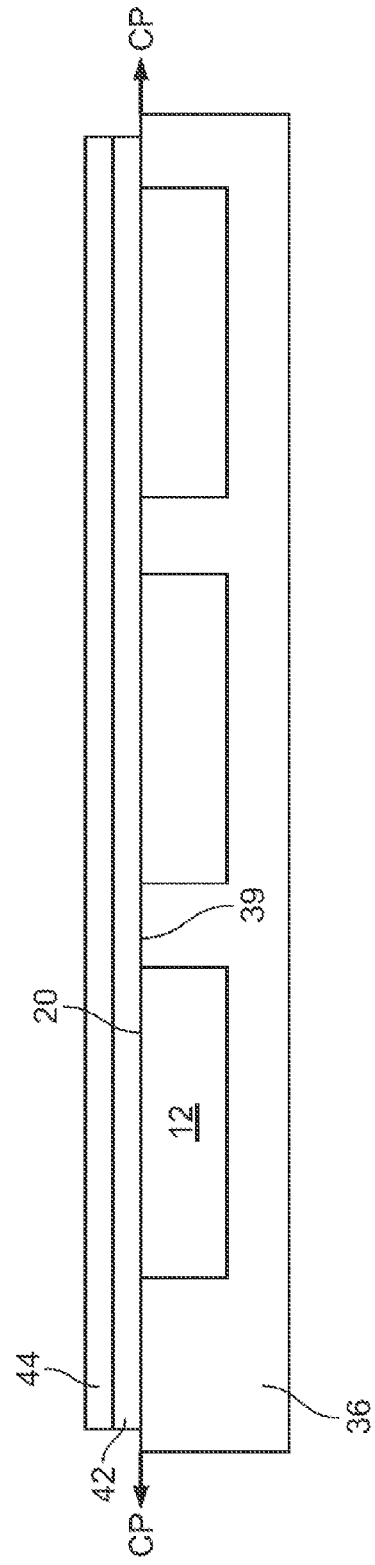
Figure 7A:
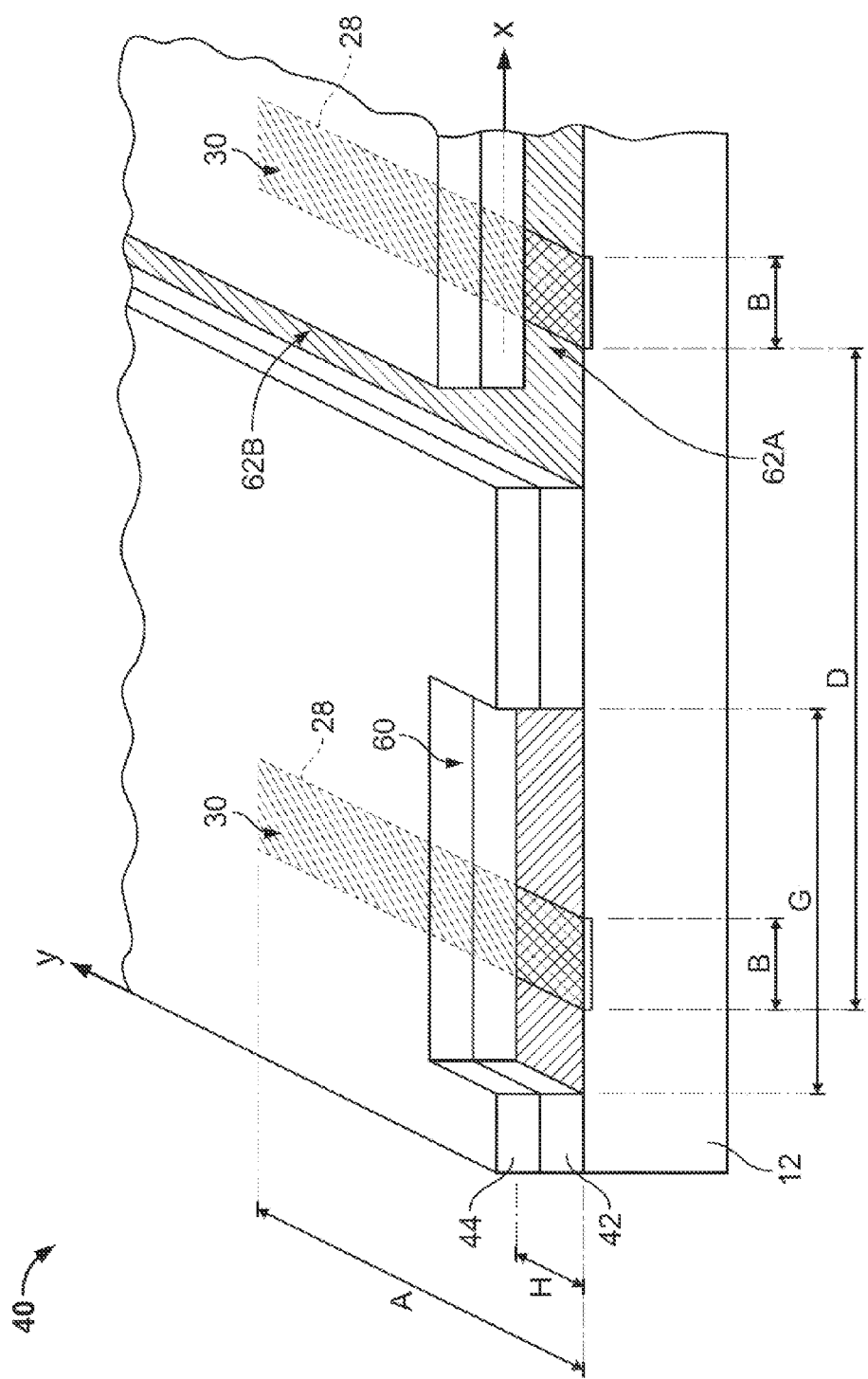
FIGS. 7A, 7B and 7C are perspective views of a portion of a microelectronic assembly at stages of a method of fabricating a microelectronic assembly including a molded structure with a plurality of microelectronic elements arranged side by side, in accordance with one embodiment of the disclosure.

In one embodiment, the dielectric material of the layer can be inorganic, such as an oxide or nitride. In such embodiment, openings at desired locations and of desired dimensions may be formed in the dielectric layer 42 by applying a photoresist layer 44 thereon, as shown in FIG. 6, selectively removing portions of the layer 44 to uncover selected portions of the dielectric layer, and then etching the uncovered dielectric layer regions to form openings 60 and 62 in the dielectric layer 42, as shown in FIG. 7A. It is to be understood that any conventional photolithography technique may be used to selectively form openings in the dielectric layer extending to the front surfaces 20 of the chips or the surface portions 39 of the encapsulant. In one embodiment, the openings in the dielectric layer may be formed by ablating, such as using a laser, punching, or etching the dielectric, and a photoresist layer is not applied. In another embodiment, where the dielectric is a photosensitive material, such as a photosensitive material of the type commonly used as a solder mask on electronic components, the openings may be formed by photographically patterning the dielectric.

Figure 7B:
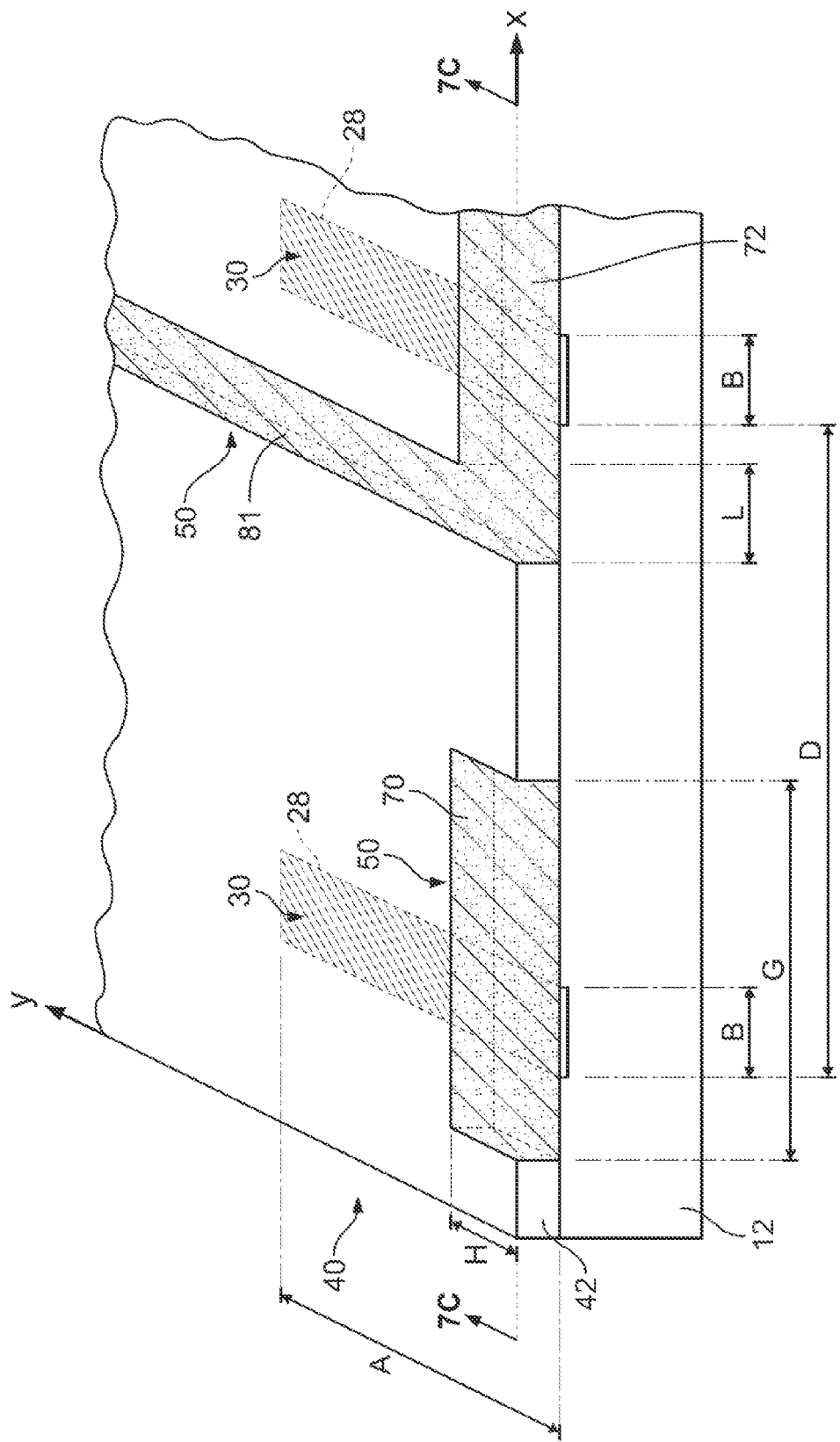
Figure 7C:
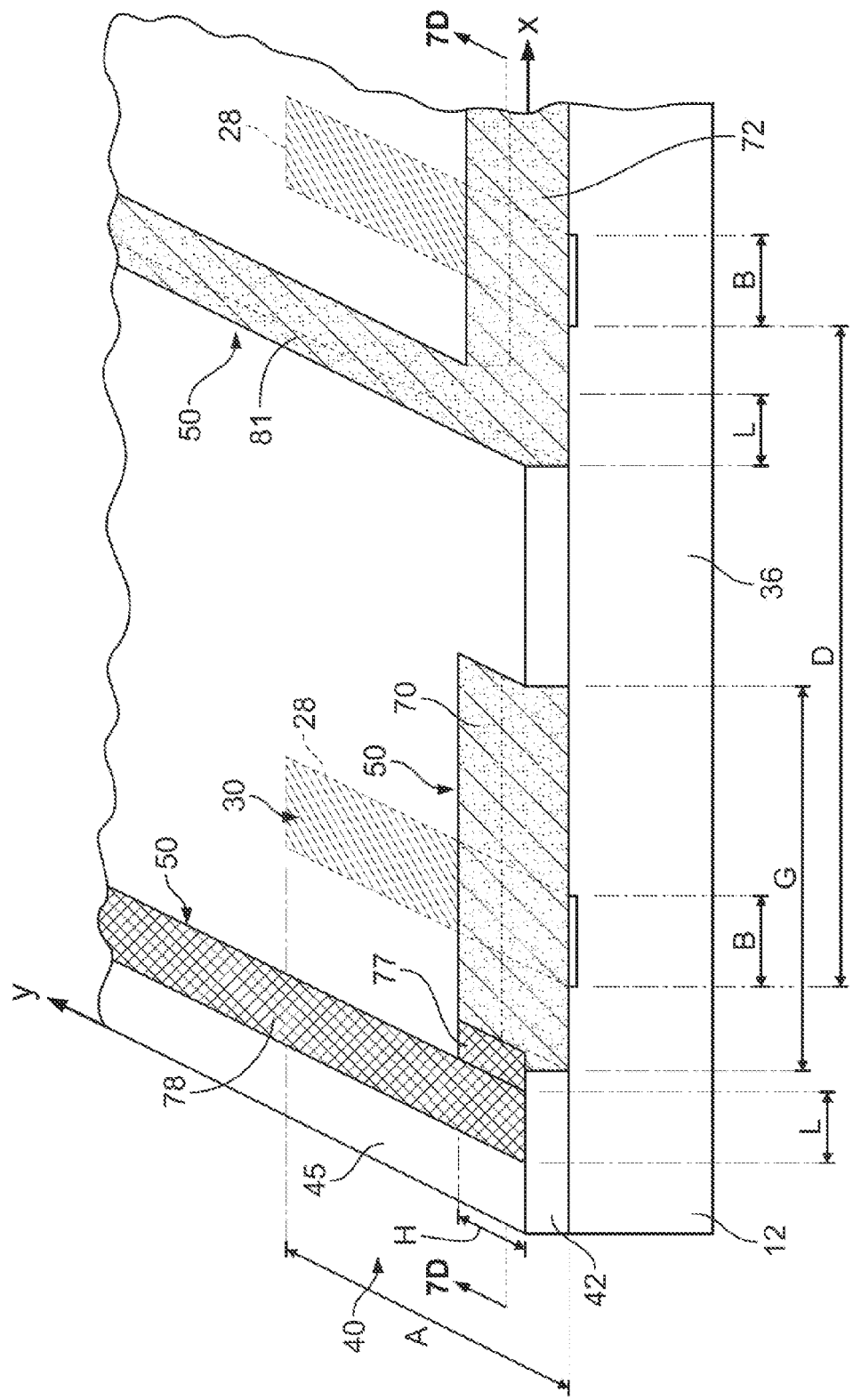

Referring to FIGS. 7A, 7B and 7C, which show perspective views of a portion of the molded structure 40 of FIG. 6 following processing to form openings in the dielectric layer 42, the dielectric layer 42 may include an opening 60 extending, at least partially, along the front surface 30 of the element contact 28 and having a major dimension extending in a direction parallel to the x axis. A conductive portion of the redistribution layer 50 in the form of a metallized via 70 may be formed in the opening to have the same dimension as the opening 60. Further, referring to FIG. 7D, the redistribution layer 50 may include a conductive trace 76 formed from conductive traces 77 and 78 extending along the surface 45 of the dielectric layer 43. The conductive trace 77 may be in contact with the conductive via 70 and extend from the via 70 in the negative x-axis direction. The conductive trace 78 may extend from the trace 77 in the positive y-axis direction. The conductive trace 77 may have a first dimension extending in a direction parallel to the direction the dimension G of the via 70 extends, and a second dimension extending transverse to the first dimension and which may be parallel to the dimension H of the via 70.

In addition, a conductive portion 71 of the redistribution layer 50 may be formed in an opening 62 in the dielectric layer 42. The conductive portion 71 may have a uniform depth along its length, and include a conductive portion 72 that extends, at least partially, along the front surface 30 of the element contact 28 in an opening portion 62A of the opening 62 and has a major dimension extending in a direction parallel to the x axis, and a conductive portion 81 that extends along the front face of the chip 12 in an opening portion 62B of the opening 62 extending from the opening portion 62A in a direction parallel to the y axis. The conductive trace 78 and the conductive portion 81 each may have a width L transverse to the direction in which the major dimensions of such elements extend along the surface of dielectric layer, where L is at least about one micron.

The conductive portions of the redistribution layer 50 may be formed, for example, by photolithographic patterning or like techniques, to extend along the front surfaces of the chips and the surface portions 39 of the encapsulant, or along the surface 45 of the dielectric layer. In one embodiment, the conductive portions in openings in the dielectric layer may be formed by deposition, for example, electrolytic or electroless metal plating or deposition of conductive material or a conductive matrix material, or by printing of a conductive paste selectively, using a stencil, into the opening to form the conductive portion, such as in the form of a conductive via. The conductive portions may have one or more individual layers of metal, and be formed from nickel, gold, copper, or a combination of nickel and copper or nickel and gold or other metal. In one embodiment, the conductive portions on the surface of the dielectric layer may be formed by applying a seed layer over the entire surface, applying a photoresist layer and patterning the photoresist layer, removing the seed layer at selected portions according to the patterned photoresist layer such that the seed layer remains at portions where the conductive traces are to be formed on the surface of dielectric layer and over the conductive vias previously formed, and then electroplating such that the conductive material is formed upon the seed layer portions.

In one embodiment, the vias 70 and the conductive portions 72, 81 may be formed by a same metal deposition at the same time. Also, the conductive portions 77, 78, and any other conductive portion formed on the surface of the dielectric layer 42, may be formed by a same metal deposition at the same time.

Figure 8:
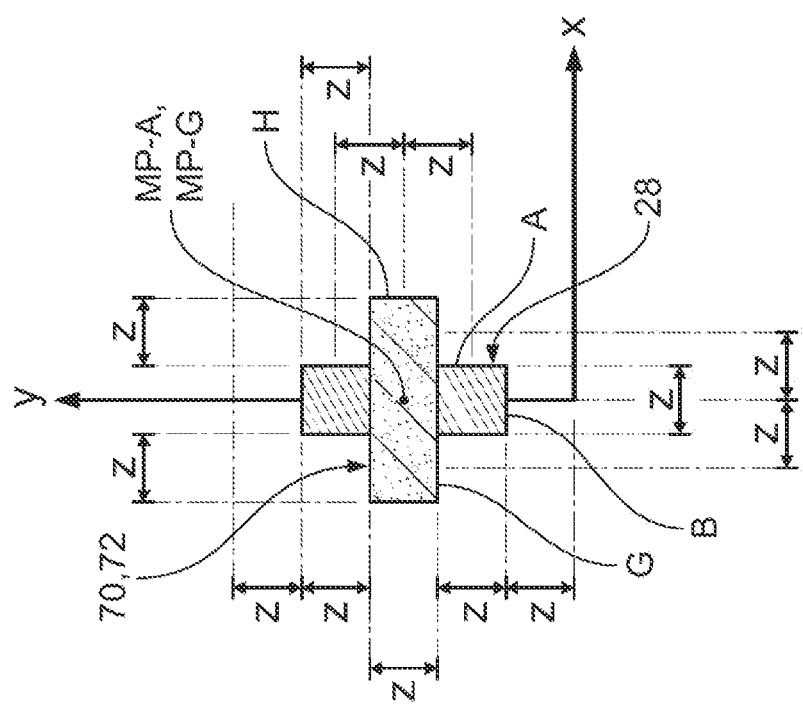
FIG. 8 is a diagrammatic plan view of a contact element of a chip contacting a conductive portion of a redistribution layer, in accordance with an embodiment of the disclosure.

To illustrate a tolerance for misplacement provided for by a redistribution layout for the microelectronic assembly 10 including the molded structure 40 in accordance with the present invention, an exemplary redistribution layout is described with reference to FIG. 8. Referring to FIG. 8 and also FIGS. 7B and 7C, each of the conductive vias 70 and the conductive portions 72 may have a dimension G extending in a direction parallel to the x axis and a dimension H extending in a direction parallel to the y axis, where the dimension G is greater than the dimension H, the dimensions A and G are orthogonal and the dimensions B and H are orthogonal. In addition, the dimensions G and A are the same, the dimensions B and H are the same, and the dimension A is three times the dimension B. Further, for example, the dimensions A and B of the element contact are 15 microns and 5 microns, respectively, the dimensions C and D of the pitch of the contacts are 20 microns and 40 microns, respectively, and the width L of the conductive trace 78 and the conductive portion 81 is about one micron. Also, a minimum area of contact of the element contact to a conductive portion that is needed to ensure a reliable electrical interconnection therebetween is equal to $z^2$, where z is one third of the dimension A.

Figure 9A:
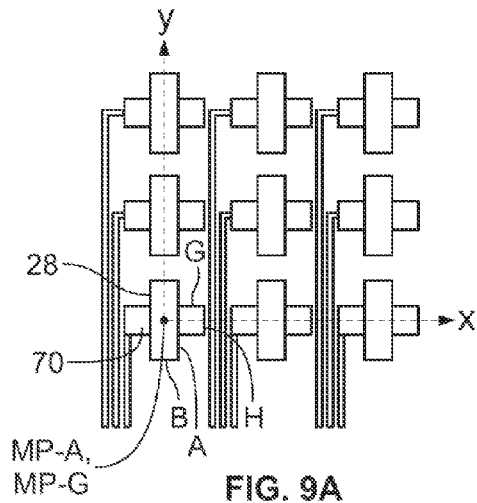
FIGS. 9A-9E are diagrammatic plan views of element contacts of chips contacting conductive portions of a redistribution conductive layer with the element contacts respectively at different placement positions, in accordance with embodiments of the disclosure.
Figure 9B:
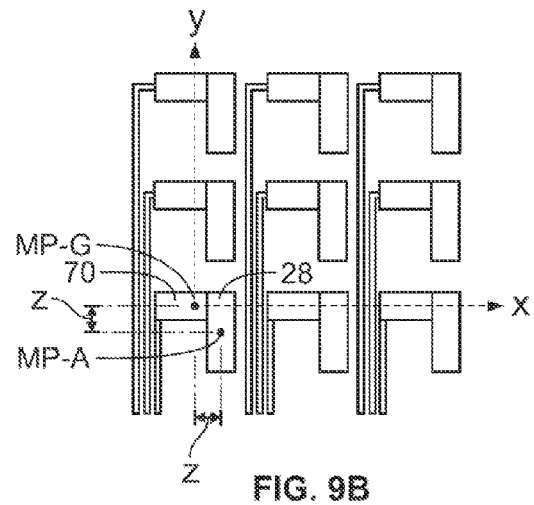
Figure 9C:
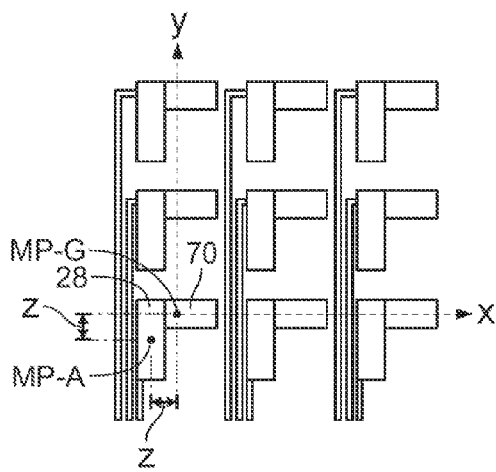
Figure 9D:
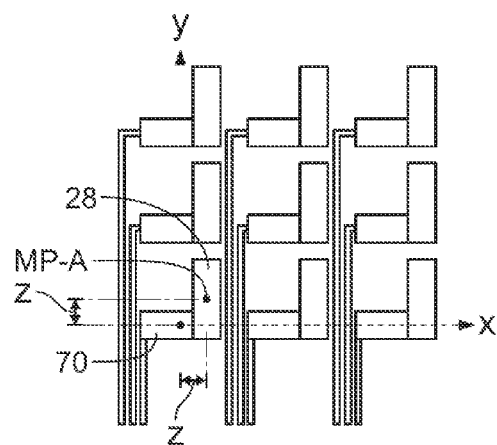
Figure 9E:
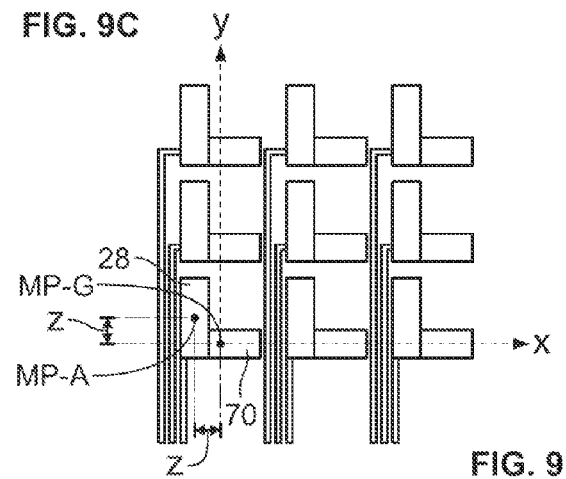

FIGS. 9A-9E illustrate an exemplary range of positions of element contacts 28 of a chip relative to corresponding conductive portions (vias 70 or portions 72) of the redistribution layer, in accordance with the exemplary redistribution layout, that may provide for sufficient contact of the element contacts to the corresponding conductive portions such that reliable electrical interconnection therebetween may be obtained, despite misplacement of contact elements from an ideal placement position according to the redistribution layout. The range of positions, in other words, the tolerance for misplacement, is in accordance with the redistribution layout, which defines the dimensions and arrangement of the conductive portions of the redistribution layer and the dimensions and pitch of the element contacts of the chips for the microelectronic assembly. For the exemplary redistribution layout, the chips may be misplaced during formation of the molded structure 40 up to a distance of z, or 5 microns, in the directions of each of the x and y axis from the perfect placement position. FIGS. 8 and 9A show the perfect placement position, where the midpoint MP-A of the dimension A of the element contact is aligned, in a thickness direction of the assembly, with the midpoint MP-G of the dimension G of the via 70. FIGS. 9B-9E illustrate the extent of misplacement of the positions of the contacts that is within the tolerance for misplacement of the redistribution layout for the assembly. In FIGS. 9B-9E, the midpoint MP-A of the element contact is positioned not more than a distance z, or 5 microns, in the direction of the x and/or y axes away from the midpoint MP-G. When the chip is positioned in the molded structure 40 such that the midpoints MP-A of the contacts are displaced not more than 5 microns in the direction of the x and/or y axes away from the midpoints MP-G of the corresponding conductive portions, which are positioned at the perfect placement position in accordance with the redistribution layout, the contacts are within the tolerance for misplacement. In such condition, a sufficient area of the front surface of the element contact, namely, an area of 25 square microns ($z^2$), contacts the corresponding conductive portion (via 70) to provide for a reliable electrical contact therebetween. Thus, for the exemplary redistribution layout, the chip may be misplaced in the molded structure up to 5 microns in the directions of the x and/or y axes from the perfect placement position, and a reliable electrical interconnection between the contact element and the conductive portion may still be obtained for the assembly 10. Referring to FIG. 8, for the exemplary layout, and assuming the layout provides that the contact elements 28 are to be positioned relative to the conductive vias 70 such that the dimension A of the element 28 is orthogonal to the dimension G of the conductive via 70, the range of positions that the contact element 28 may be positioned relative to the conductive via 70 and still be within the tolerance for misplacement may include those positions within an area that is the product of (i) the sum of B and twice z and (ii) the sum of A and twice z.

Figure 10:
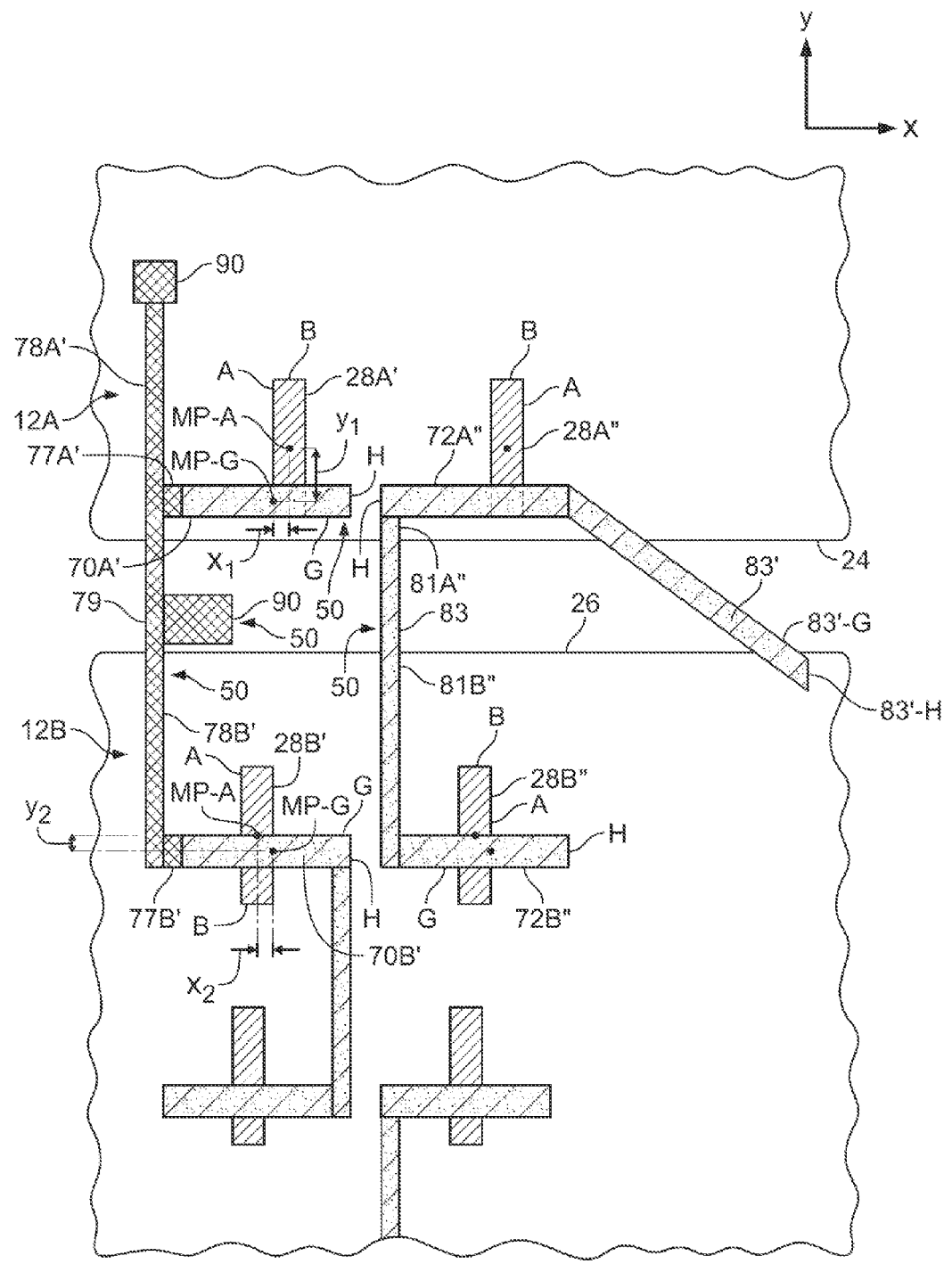
FIG. 10 is an exemplary diagrammatic plan view illustrating interconnections between element contacts of adjacent chips of a microelectronic assembly, in accordance with an embodiment of the disclosure.

FIG. 10 illustrates an exemplary embodiment of a microelectronic assembly in which chips 12A and 12B of the molded structure 40, having contacts with dimensions according to the exemplary layout described above with reference to FIG. 8, are arranged misplaced relative to ideal placement positions as set forth by the exemplary layout, where the misplacement is within the tolerance for misplacement of the exemplary layout. For example, the contacts of the chip 12A may be misplaced distances x1 and y1 in the positive x and y axis directions relative to an ideal placement position, and the contacts of the chip 12B may be misplaced distances x2 and y2, respectively, in the positive y axis direction and the negative x axis direction relative to an ideal placement position, where each of x1, y1, x2 and y2 is less than z. Further, the redistribution layer 50 may be formed so that conductive portions electrically interconnecting an element contact 28A' of the chip 12A with an element contact 28B' of the chip 12B include: a conductive via 70B' contacting the contact 28B' and having the dimension G extending in the x axis direction; a conductive trace 77B' extending from the via 70B' in the negative x-axis direction along the surface 45 of the dielectric layer; a conductive trace 78B' extending from the trace 78B' in the positive y axis direction along the surface 45 of the dielectric layer to an edge 26 of the chip 12B; a conductive trace 79 extending from the edge 26 of the chip 12B along the surface 45 of the dielectric layer to an adjacent edge 24 of the chip 12A; a conductive trace 78A' extending from the trace 79 in the positive y axis direction along the surface 45 of the dielectric layer over the front face of the chip 12A; a conductive trace 77A' extending in the positive x axis direction from the trace 78A' along the surface 45 of the dielectric layer; and a conductive via 70A' extending from the trace 77A' along the front face of the chip 12A in the positive x axis direction to contact the element contact 28A'.

In one embodiment, the trace 78A' may extend in the positive y axis direction away from the via 70A' on the surface 45 to a pad 90 also on the surface 45, where the pad 90 is part of the redistribution layer 50. In addition, a pad 90 of the redistribution layer 50 may be positioned on the surface 45 between the adjacent edges of the chips 12A and 12B and contacting the trace 79.

Still referring to FIG. 10, an electrical interconnection between an element contact 28A' of the chip 12A and an element contact 28B" of the chip 12B formed from portions of the redistribution layer 50 may include: a conductive portion 72B" contacting the contact 28B' and having the dimension G extending in a direction parallel to the x axis; a conductive portion 81B" extending in the positive y axis direction along the front face of the chip 12B from the portion 72A" to the edge of the chip 12B; a conductive portion 83 extending from the edge 26 of the chip 12B to the edge 24 of the chip 12 along the surface portion 39 of the encapsulant; a conductive portion 81A" extending from the edge 24 of the chip 12A in the positive y axis direction along the front face of the chip 12B; and a conductive portion 72A" extending from the portion 81A" along the front face of the chip 12B in the positive x axis direction to contact the element contact 28A".

In some embodiments, the redistribution layer 50 may include a conductive portion within an opening in the dielectric layer, or a conductive trace on the surface of the dielectric layer, that extends from a conductive via or another conductive trace, respectively, in a direction that is transverse and not orthogonal to the direction that the major dimension of the conductive via or the another conductive trace is extending. For example, referring to FIG. 10, a conductive portion 83' may have a major dimension 83'-G that extends in a direction other than parallel to the x axis. In addition, the dimension 83'-G may extend in direction other than parallel to both the x axis and y axis, and a dimension 83'-H of the portion 83' may extend transversely to the dimension 83'-G at other than an orthogonal angle.

In one embodiment, the pad 90 may have a dimension extending parallel to the front surface of the chip of between 20 and 150 microns. In another embodiment, the pad 90 may have the same width dimension as the conductive traces of the redistribution layer 50 extending along the surface 45 of the dielectric layer.

It is to be understood that the dimensions and pitch of the element contacts and the dimensions and arrangement of the conductive portions of the redistribution layer to contact the element contacts may be varied in accordance with a redistribution layout, where the dimension A is at least twice B and the dimension G exceeds the dimension H as illustrated above, to provide for lesser or greater tolerance for misplacement for a microelectronic assembly.

In one embodiment, referring to FIG. 8, the redistribution layout may ensure a reliable electrical interconnection between an element contact and the corresponding conductive portion which the element contact is contacting, where the element contact is positioned misplaced relative to a perfect placement position in the direction of at least one of the x axis and/or the y axis to an extent greater than 20% and less than 100% of the pitch of the element contacts in the direction of the x axis and/or the y axis. In a further embodiment, the tolerance for misplacement may allow misplacement of the element contact relative to a perfect placement position in the direction of at least one of the x axis and/or the y axis to an extent of up to 80% of the pitch of the element contacts in the direction of the x axis and/or the y axis.

Figure 13:
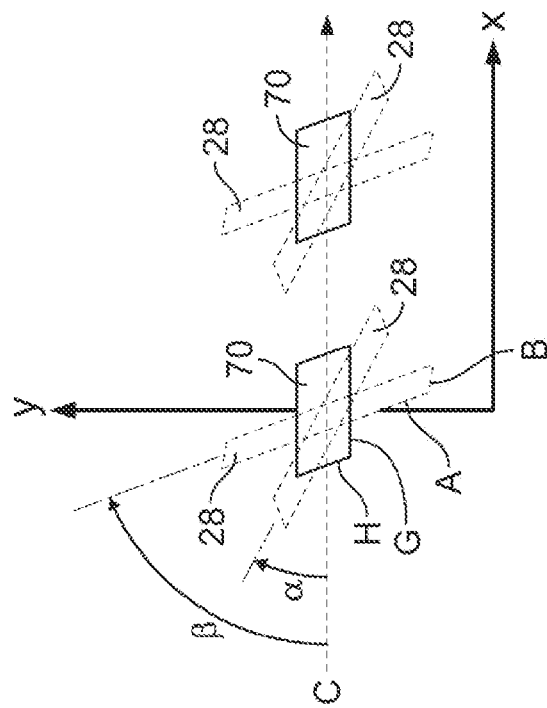
FIG. 13 is a diagrammatic plan view of contact elements of a chip contacting conductive portions of a redistribution layer, in accordance with an embodiment of the disclosure.

Referring to FIG. 13, in one embodiment of a redistribution layout for a microelectronic assembly, the element contacts 28 may be arranged on the front surface of the chips such that, when the redistribution layer is applied over the front face of the chips, the dimension A of the element contacts extends transverse to the dimension G of the corresponding conductive vias 70 at an angle between alpha and beta, where alpha is 30 degrees and beta is 60 degrees. In addition, as shown in FIG. 13, for each of the contacts 28 of a chip 12, the dimensions A and B may extend transversely but not orthogonally to each other. Also, the dimensions G and H of conductive vias 70 of the redistribution layer may extend transversely but not orthogonally to each other.

In another embodiment of a redistribution layout, the element contacts may have a pitch of 20 microns in each of the x and y axis directions, and the dimensions A and B of the element contacts may be 15 and 5 microns, to provide an aspect ratio of length to width of the element contacts of 3. Alternatively, in another embodiment of a redistribution layout where the pitch of the contacts is 20 microns in each of the x and y axis directions, the dimensions A and B of the element contacts may be 18 and 1 microns, respectively, and the conductive vias 70 may have a dimension H of one micron. In a further embodiment, the pitch of the element contacts may be 100 microns in each of the x and y axis directions, and the dimensions A and B of the element contacts may be 90 and 10 microns, respectively, according to a redistribution layout.

In one embodiment, the tolerance for misplacement provided for by a redistribution layout may allow for misplacement of up to five microns in a direction of the pitch of the element contacts. Such tolerance for misplacement, advantageously, may permit that less expensive typical packaging equipment or surface mount technology (SMT) processing equipment can be used to fabricate a molded structure containing multiple chips, without impacting the reliability of microelectronic assemblies that include the molded structure.

In another embodiment, referring to FIG. 7E, a redistribution layout for a microelectronic assembly may include conductive portions 71, conductive traces 76 and conductive vias 70, similarly as described above (see FIG. 7D), and also conductive traces 92 extending along a surface 93 of a dielectric layer 94, and conductive vias 95 extending from the traces 92 through the layer 94 to a surface 96 of the layer 9, which is opposite the surface 93 and faces the surface 45 of the dielectric layer 42. In some embodiments, the via 95 may extend from the trace 92 at the surface 93 to a conductive portion 81, or alternatively to a conductive trace 76 or conductive via 70, so as to provide an electrical interconnection between the conductive trace 92 and element contacts 28 of the chip 12. The conductive traces 92 and the vias 95 may be formed similarly as the traces 76 and the vias 70, as described above.

Figure 11:
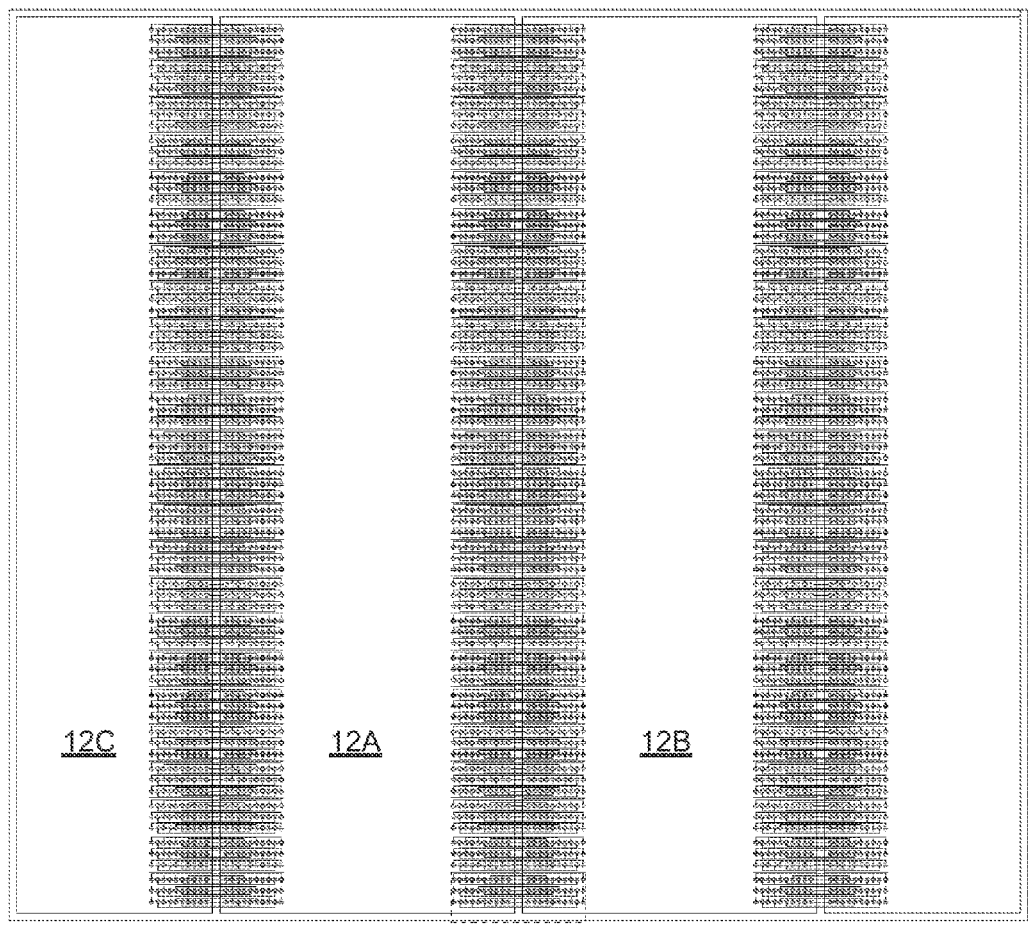
FIG. 11 is a diagrammatic plan view of a portion of a microelectronic assembly in a direction facing a redistribution layer, in accordance with an embodiment of the disclosure.
Figure 12:
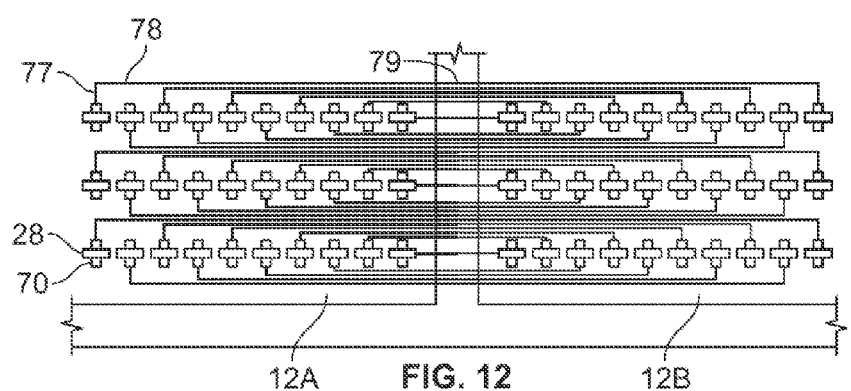
FIG. 12 is an expanded diagrammatic plan view of a portion of the microelectronic assembly as shown in FIG. 11.

FIGS. 11 and 12 illustrate plan views of an exemplary arrangement of chips 12 in a molded structure included in a microelectronic assembly in which, in accordance with a redistribution layout for the assembly, conductive vias 70 of a redistribution layer contact corresponding element contacts of adjacent chips 12A and 12B, and traces 77, 78 and 79 of the redistribution layer electrically interconnect with the vias 70 of the adjacent chips 12A, 12B, such that the contacts of one chip are electrically connected with the contacts of the other chip. In this embodiment, adjacent conductive traces 78 and 79 may have a line width of one micron and be spaced about one micron from each other.

Figure 14:
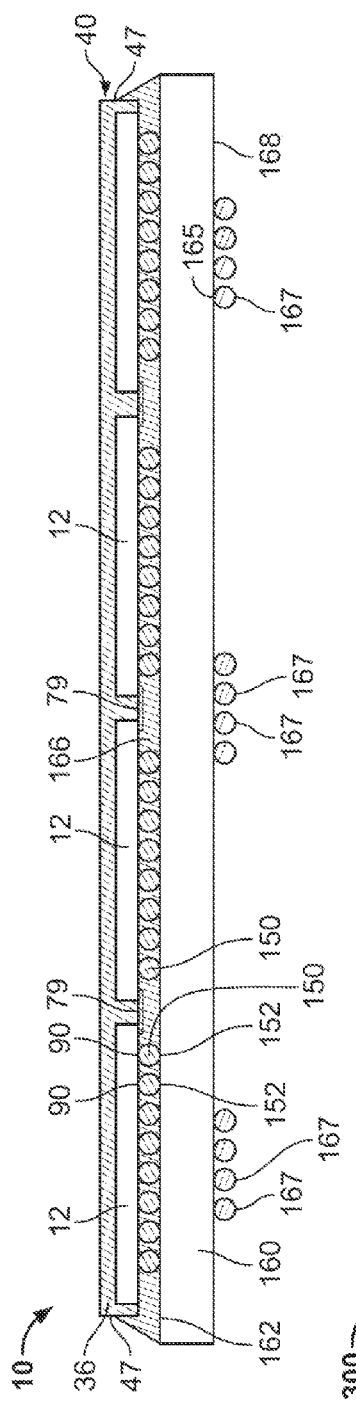
FIG. 14 is a diagrammatic sectional view of a microelectronic assembly, in accordance with one embodiment of the disclosure.

Referring to FIG. 14, in one embodiment the microelectronic assembly 10 may include the molded structure 40 and the redistribution layer 50 according to a redistribution layout, and pads 90 of the layer 50 may be at selected positions along the surface 45 of the dielectric layer (not shown). In this embodiment, the molded structure 40 is arranged in a flip-chip orientation so the front faces of the chips 12 face toward a surface 162 of a substrate unit 160 included in the assembly 10, where the surface 162 includes conductive pads 152. The pads 90 are at positions that correspond to locations at which masses of electrically conductive bond material, such as solder balls 150, may join the pads 90 and corresponding pads 152 on the surface 162. In addition, an underfill 166 may fill spaces between the conductive masses between the confronting faces of the molded structure 40 and the substrate unit 160, and also surround portions of side edges 47 of the molded structure 40. The conductive masses 150, thus, may be electrically insulated from each other by the underfill 166 and electrically interconnect contacts 28 of the chips of the molded structure with electrical circuitry (not shown) in the substrate unit. As such, the redistribution layer 50 acts as a fan out of the contacts 28 of the chips of the molded structure 40 within the assembly 10, to achieve electrical interconnections between the contacts 28 of microelectronic elements 12 of the molded structure and another microelectronic structure, such as the substrate unit 160, which may be a printed circuit board or the like, that has contacts, such as pads 152, of larger dimension than that of the element contacts 28.

In one embodiment, the masses of conductive material may be solder or gold provided on exposed pads 152 on the surface 162 of the substrate unit 160. The conductive masses 150 can comprise a fusible metal having a relatively low melting temperature, e.g., solder, tin, or a eutectic mixture including a plurality of metals. Alternatively, the conductive masses 150 can include a wettable metal, e.g., copper or other noble metal or non-noble metal having a melting temperature higher than that of solder or another fusible metal. Such wettable metal can be joined with a corresponding feature, e.g., a fusible metal feature of a circuit board to externally interconnect the microelectronic assembly to such circuit board. In a particular embodiment, the conductive masses 150 can include a conductive material interspersed in a medium, e.g., a conductive paste, e.g., metal-filled paste, solder-filled paste or isotropic conductive adhesive or anisotropic conductive adhesive.

In some embodiments, the substrate unit 160 may include pads 165 on a surface 168 which is opposite the surface 162. The pads 165 may be electrically connected with electrical circuitry (not shown) within the substrate unit 160, and configured such that conductive masses 167 may be provided on the pads 165. The masses 167, for example, may electrically interconnect the pads 165 with pads of another microelectronic component, such as a printed circuit board or the like (not shown), facing the surface 168, thereby providing for electrical connection of the another microelectronic component with the chip 12 through the substrate unit 160 and the masses 150 and 165.

Figure 15:
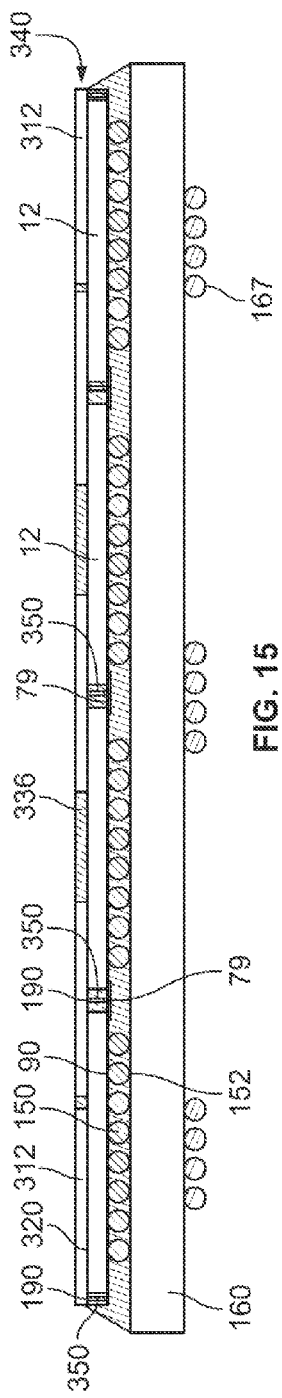
FIG. 15 is a diagrammatic sectional view of a microelectronic assembly, in accordance with one embodiment of the disclosure.

Referring to FIG. 15, in another embodiment, a microelectronic assembly 300 may include a molded structure 340 having chips 12 whose contacts are fanned out by a conductive redistribution layer 50 and solder balls 150 contacting pads 90 of the layer 50 and pads 152 of the substrate unit 160, similarly as described above for the assembly 10. In this embodiment, the molded structure 340 includes, in addition to the microelectronic elements 12 arranged side by side with front faces 20 facing the surface 162, microelectronic elements 312 arranged side by side with front faces 320 facing the rear faces 22 of the chips 12, such that the elements 12 and 312 are in a stacked configuration. The microelectronic elements 312 are arranged at predetermined positions over the microelectronic elements 12 prior to application of an encapsulant 336 over the elements 12 and 312, similarly as described above for the assembly 10, and an adhesive may be used to temporarily maintain the elements 312 fixed to the elements 12 prior application of the encapsulant. The elements 312 are positioned such that a conductive via 350 may extend through a hole formed through the encapsulant 336 from the surface 39 to a conductive pad 190 on the front face of the element 312. The pad 190 is electrically connected to contacts or other electrical circuits within the element 312. The hole may be formed by drilling after molding, or as part of the molding process. In one embodiment, the conductive via 350 extends from a conductive portion of the redistribution layer 50, such as a conductive trace 79 extending along the surface 45 of the dielectric layer between adjacent chips or a pad 90 on the surface 45, to a conductive pad 190 at the front face of one of the elements 312. In another embodiment, the conductive via 350 may be in a hole formed in the encapsulant 336 at an edge of the chip 12 positioned at an outer perimeter of the molded structure, where the via 350 extends from a pad or conductive trace (see FIG. 10) of the redistribution layer 50 to a pad 190 at the front face of the element 312.

In another embodiment, the encapsulant 336 can be prefabricated to have the shape of the edges of the chips 12 and the uncovered portions of the temporary carrier, and also include a pre-formed hole patterned to match the vias 350 to be formed. The encapsulant 336, in a softened state, may then be attached, e.g., pressed into position over the stacked chips, so that the hole is vertically aligned with a pad on the chips 312. In one embodiment, the encapsulant in such case may be partially cured, e.g., a "B-stage" material, when attached to the stacked chips.

In a particular embodiment, at least one of the conductive vias 350 can be formed by depositing a conductive metal within an opening extending through the planarized encapsulant 336. The depositing of the conductive metal to form the conductive vias 350 can be done by plating of the metal onto an inner surface of the opening. The conductive vias 350 can be solid, or the conductive vias can include an internal void that can be filled with a dielectric material. In another example, the conductive vias can be formed by depositing a conductive sintering material into openings in the encapsulant 336, e.g., by a screening, stenciling, or dispensing process, and subsequently curing the sintering material to form a void-free conductive matrix in the openings. In yet another example, a screening, stenciling, or dispensing process can be used to deposit a conductive paste, such as solder paste or silver-filled paste, within the openings.

Figure 16:
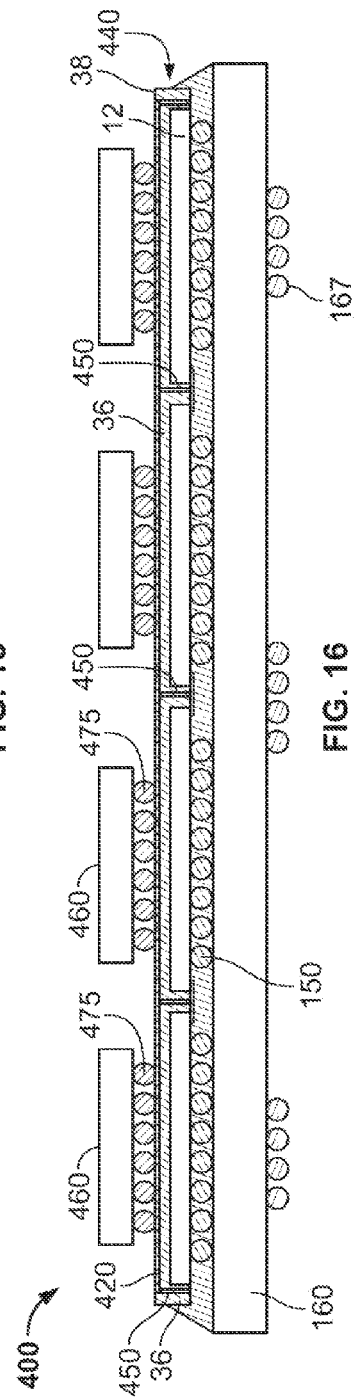
FIG. 16 is a diagrammatic sectional view of a microelectronic assembly, in accordance with one embodiment of the disclosure.

Referring to FIG. 16, in another embodiment, a microelectronic assembly 400 may include a molded structure 440 having chips 12 whose contacts are fanned out by a conductive redistribution layer 50 and solder balls 150 contacting pads 90 of the layer 50 and pads 152 of the substrate unit 160, similarly as described above for the assembly 10. In this embodiment, the assembly 400 includes a second or backside conductive redistribution layer 420 formed at the surface 38 of the encapsulant 36. Conductive vias 450, formed similarly like the vias 350, may extend through holes in the encapsulant from the surface 39, and optionally from a pad of the layer 50 at the surface 39, to a pad (not shown) of the layer 420. The conductive portions of the layer 420 may be formed by any suitable metal deposition technique, which may include sputtering, electroless or electrolytic plating, or printing or stenciling of an electrically conductive paste or conductive matrix material, for example, similarly as described above for the redistribution layer 50.

Further in this embodiment, the assembly 400 may include microelectronic packages 460, such as including memory chips, having front faces facing the redistribution layer 420, and masses 475 of conductive material, similar or the same as the solder balls 150, formed to contact pads (not shown) at the front face of the packages 460 and pads (not shown) of the layer 420. The solder balls 475, thus, may electrically interconnect contacts of chips within the packages 460 with contacts of the chips 12 of the molded structure through the redistribution layer 420, the vias 450 and the redistribution layer 50.

Advantageously, the dimensions and arrangement of the element contacts, where a major dimension of the element contacts is at least twice another dimension thereof transverse to the major dimension of the element contacts, and the dimensions and arrangement of the conductive portions of the redistribution layer that are to contact the element contacts in a microelectronic assembly including the microelectronic elements within a molded structure, where a major dimension of such conductive portions is greater than another dimension thereof transverse to the major dimension of the conductive portions, are in accordance with a redistribution layout which provides a tolerance to inaccuracies in chip placement and, thus, can address particular challenges of electrical interconnection between chips even when the element contacts of the chips are arranged at a very fine pitch, such as five microns. The present invention, thus, may permit manufacture of microelectronic assemblies, each assembly including multiple chips in a molded structure which are electrically interconnected with one another by very fine electrical interconnections so as to operate in combination to provide a desired functionality, at a yield greater than that typically obtained when multiple chips on a same monolithic wafer are electrically interconnected with interconnections of a size comparable to that utilized in microelectronic assemblies of the present invention.

Figure 17:
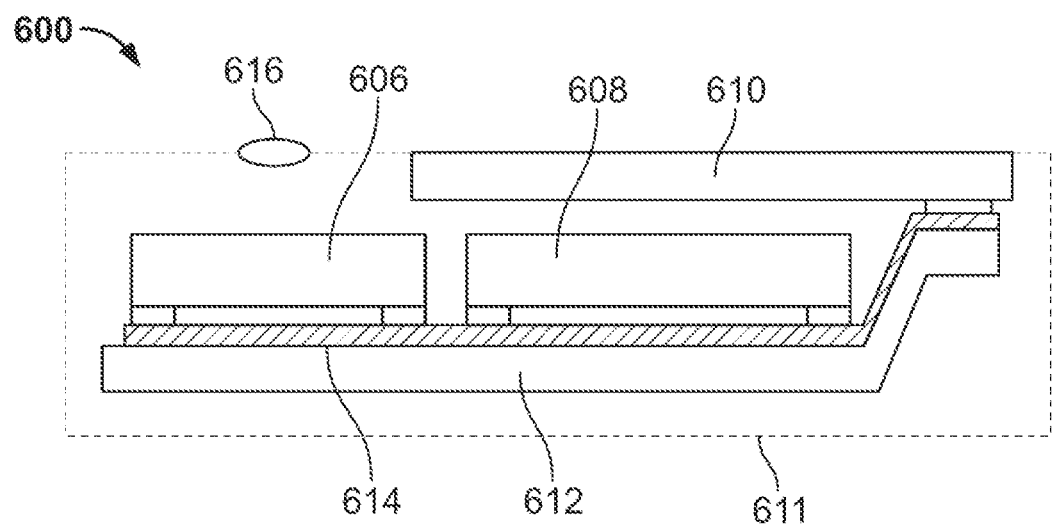
FIG. 17 is a schematic depiction of a system according to one embodiment of the disclosure.

The microelectronic assemblies described above can be utilized in construction of diverse electronic systems, as shown in FIG. 17. For example, a system 600 in accordance with a further embodiment of the disclosure includes a microelectronic assembly 606 as described above in conjunction with other electronic components 608 and 610. In the example depicted, component 608 is a semiconductor chip whereas component 610 is a display screen, but any other components can be used. Of course, although only two additional components are depicted in FIG. 17 for clarity of illustration, the system may include any number of such components. The microelectronic assembly 606 may be any of the assemblies described above. In a further variant, any number of such microelectronic assemblies may be used. Microelectronic assembly 606 and components 608 and 610 are mounted in a common housing 611, schematically depicted in broken lines, and are electrically interconnected with one another as necessary to form the desired circuit. In the exemplary system shown, the system includes a circuit panel 612 such as a flexible printed circuit board, and the circuit panel includes numerous conductors 614, of which only one is depicted in FIG. 17, interconnecting the components with one another. However, this is merely exemplary; any suitable structure for making electrical connections can be used. The housing 611 is depicted as a portable housing of the type usable, for example, in a cellular telephone or personal digital assistant, and screen 610 is exposed at the surface of the housing. Where structure 606 includes a light sensitive element such as an imaging chip, a lens 616 or other optical device also may be provided for routing light to the structure. Again, the simplified system shown in FIG. 17 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
   at least first and second microelectronic elements each having a front face arranged in a common plane and arranged side by side in a molded structure, each of the microelectronic elements having a plurality of element contacts at the front face, each of the element contacts having a first dimension in a first direction parallel to the common plane and having a second dimension in a second direction parallel to the common plane, the first direction being transverse to the second direction, the first dimension being at least twice the second dimension;
   a dielectric layer extending along the front face of each of the first and second microelectronic elements and onto an intermediate surface between adjacent edges of the first and second microelectronic elements; and
   a conductive redistribution layer including first and second conductive vias extending through the dielectric layer to first and second element contacts of the first and second microelectronic elements, respectively, each of the first and second conductive vias having a third dimension in a third direction and a fourth dimension in a fourth direction, the fourth direction being transverse to the third direction and the first direction, the fourth dimension being greater than the third dimension.

2. The assembly of claim 1, wherein, for each of the first and second microelectronic elements, the element contacts thereof are arranged spaced from each other according to a pitch of a first distance in the first direction and a second distance in the second direction,
   wherein the first element contact and the second element contact are misplaced relative to respective first and second predetermined placement positions in at least one of the first or second directions to an extent greater than 20% and less than 100% of the first distance or the second distance.

3. The assembly of claim 1, wherein the first direction is substantially orthogonal to the second direction and the fourth direction.

4. The assembly of claim 1, wherein the first direction is at an angle of between 30 and 60 degrees with respect to the fourth direction.

5. The assembly of claim 1, wherein the first and fourth dimensions are substantially equal.

6. The assembly of claim 1, wherein the first and fourth dimensions are equal to about fifteen microns.

7. The assembly of claim 1, wherein one of the first and second microelectronic elements includes a logic chip and the other of the first and second microelectronic elements includes a memory chip.

8. The assembly of claim 1, wherein the conductive redistribution layer is in accordance with a redistribution layer layout defining electrical interconnections with the contacts of the first and second microelectronic elements to provide a predetermined functionality for the assembly, wherein the functionality is not obtained if at least one of the electrical interconnections is absent.

9. The assembly of claim 1 further comprising:
   a substrate unit having a front surface facing the common plane and a rear surface remote from the front surface, the front surface of the substrate unit including a plurality of contact elements; and
   at least one solder mass extending between the redistribution layer and the front surface of the substrate unit and electrically connecting at least one of the contact elements of the substrate unit with at least one of the first or second element contacts through at least one of the first or second conductive vias, respectively.

10. The assembly of claim 9, wherein the rear surface of the substrate unit includes at least one contact element configured so that a solder mass may be connected thereto.

11. The assembly of claim 1, wherein the molded structure includes at least one third microelectronic element including at least one element contact, at least one of the first or second microelectronic elements being between the common plane and the third microelectronic element; and
   a third conductive via formed in an encapsulant of the molded structure, the third via extending from the common plane to the element contact of the third microelectronic element.

12. The assembly of claim 11, wherein the third conductive via contacts a conductive portion of the conductive redistribution layer spaced from an edge of at least one of the first or second microelectronic elements.

13. The assembly of claim 11, wherein the first and second microelectronic elements are between the common plane and the third microelectronic element.

14. The assembly of claim 11, wherein the third microelectronic element includes a memory chip and at least one of the first or second microelectronic elements includes a logic chip.

15. The assembly of claim 11 further comprising:
   a substrate unit having a front surface facing the common plane and a rear surface remote from the front surface, the front surface of the substrate unit including a plurality of contact elements; and
   at least one solder mass extending between the redistribution layer and the front surface of the substrate unit and electrically connecting at least one of the contact elements of the substrate unit with at least one of the first or second element contacts through at least one of the first or second conductive vias, respectively.

16. The assembly of claim 1, wherein the molded structure includes a surface opposite the common plane, the assembly further comprising:
   a second conductive redistribution layer extending along the surface of the molded structure and including a plurality of conductive elements,
   a third conductive via formed in an encapsulant of the molded structure, the third via extending from the common plane to at least one of the conductive elements of the second redistribution layer.

17. The assembly of claim 16, wherein the third conductive via contacts a conductive portion of the conductive redistribution layer spaced from an edge of at least one of the first and second microelectronic elements, the assembly further comprising:
   a substrate unit having a front surface facing the common plane and a rear surface remote from the front surface, the front surface of the substrate unit including a plurality of contact elements;
   at least one solder mass extending between the redistribution layer and the front surface of the substrate unit and electrically connecting at least one of the contact elements of the substrate unit with at least one of the first or second element contacts through at least one of the first or second conductive vias, respectively;
   a microelectronic package having a front face facing the second redistribution layer, the front face of the package including at least one contact element; and
   at least one second solder mass extending between the second redistribution layer and the front face of the package and electrically connecting the at least one contact element of the package with at least one of the first or second element contacts, respectively, of the first or second microelectronic elements through the at least one conductive element of the second redistribution layer.

18. The assembly of claim 17, wherein the package includes at least one memory chip.

19. A microelectronic assembly comprising:
at least first and second microelectronic elements each having a front face arranged in a common plane and arranged side by side in a molded structure, each of the microelectronic elements having a plurality of element contacts at the front face, each of the element contacts having a first dimension in a first direction parallel to the common plane and having a second dimension in a second direction parallel to the common plane, the first direction being transverse to the second direction, the first dimension being at least twice the second dimension;
a dielectric layer extending along the front face of each of the first and second microelectronic elements and onto an intermediate surface between adjacent edges of the first and second microelectronic elements; and
a conductive redistribution layer including a conductive portion disposed within an opening of the dielectric layer having a uniform depth and extending from the first microelectronic element to the second microelectronic element, the conductive portion including a first conductive portion contacting a first element contact of the first microelectronic element, a second conductive portion contacting a second element contact of the second microelectronic element and an intermediate conductive portion extending from the first conductive portion to the second conductive portion, the first and second conductive portions having a third dimension in a third direction and a fourth dimension in a fourth direction, the fourth direction being transverse to the third direction and the first direction, the fourth dimension being greater than the third dimension.

20. The assembly of claim 19, wherein, for each of the first and second microelectronic elements, the element contacts thereof are arranged spaced from each other according to a pitch of a first distance in the first direction and a second distance in the second direction,
wherein the first element contact and the second element contact are misplaced relative to first and second predetermined placements positions in at least one of the first or second directions to an extent greater than 20% and less than 100% of the first distance or the second distance.

* * * * *